(12) United States Patent
Krishnani et al.

(10) Patent No.: US 9,229,053 B2
(45) Date of Patent: Jan. 5, 2016

(54) METHODS AND APPARATUS FOR DEBUGGING LOWEST POWER STATES IN SYSTEM-ON-CHIPS

(71) Applicant: Nvidia Corporation, Santa Clara, CA (US)

(72) Inventors: Padam Krishnani, Karnataka (IN); Supreet Agrawal, Karnataka (IN); Kwanjee Ng, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 114 days.

(21) Appl. No.: 14/165,871

(22) Filed: Jan. 28, 2014

(65) Prior Publication Data

US 2015/0212154 A1    Jul. 30, 2015

(51) Int. Cl.
*G01R 31/317* (2006.01)
*G06F 1/32* (2006.01)
*G06F 1/26* (2006.01)

(52) U.S. Cl.
CPC .... *G01R 31/31705* (2013.01); *G01R 31/31721* (2013.01); *G06F 1/26* (2013.01); *G06F 1/266* (2013.01); *G06F 1/3203* (2013.01); *G06F 1/3206* (2013.01); *G06F 1/329* (2013.01); *G06F 1/3228* (2013.01); *G06F 1/3243* (2013.01)

(58) Field of Classification Search
CPC .............. G01R 31/31705; G01R 31/31721; G06F 1/3203; G06F 1/3206; G06F 1/3228; G06F 1/3243; G06F 1/329; G06F 1/26; G06F 1/266

USPC ................... 714/745; 713/320, 323
See application file for complete search history.

(56) References Cited

U.S. PATENT DOCUMENTS

| | | | |
|---|---|---|---|
| 2005/0097378 A1* | 5/2005 | Hwang | 713/320 |
| 2008/0307240 A1* | 12/2008 | Dahan et al. | 713/320 |
| 2010/0281309 A1* | 11/2010 | Laurenti et al. | 714/45 |
| 2012/0151235 A1* | 6/2012 | Nasrullah et al. | 713/323 |
| 2013/0261814 A1* | 10/2013 | Shrall et al. | 700/286 |
| 2014/0258760 A1* | 9/2014 | Wells et al. | 713/330 |
| 2014/0269881 A1* | 9/2014 | He et al. | 375/231 |
| 2014/0281668 A1* | 9/2014 | He et al. | 714/4.5 |
| 2015/0082011 A1* | 3/2015 | Mellinger et al. | 713/1 |
| 2015/0169036 A1* | 6/2015 | Sodhi et al. | 713/320 |

OTHER PUBLICATIONS

Pradhan et al., Low power finite state machine synthesis using power-gating, Mar. 21, 2011, Integration, the VLSI journal 44 (2011) 175-184.*

* cited by examiner

*Primary Examiner* — John J Tabone, Jr.

(57) ABSTRACT

Methods and apparatus for debugging finite state machine are disclosed. The method includes implementing a debug logic circuit and connecting the debug logic circuit to a system on chip (SoC) voltage source. The method includes operating a finite state machine that sequences the SoC from a low power state to a next low power state and generating respective output signals corresponding to the low power states and wherein the finite state machine is connected to Always On voltage source. The method includes masking the output signals to generate respective masked output signals, and applying the masked output signals to SoC circuit elements to prevent from transitioning into low power states and hence keeping the debug logic circuitry alive. The method includes debugging the finite state machine in the lowest power state by the debug logic circuit.

24 Claims, 3 Drawing Sheets

METHODS AND APPARATUS FOR DEBUGGING LOWEST POWER STATES IN SYSTEM-ON-CHIPS

TECHNICAL FIELD

The present disclosure is directed, to methods and apparatus for debugging lowest power states in System-On-Chips.

BACKGROUND

Mobile phones, tablets and other portable electronic devices continue to offer higher performance and more features. Consequently, portable electronic devices consume more battery power. To prolong battery life without sacrificing performance or features, it is desirable to minimize active and leakage power consumption in portable devices.

In most portable devices, one or more System-On-Chips (SoCs) are implemented to perform various functions. During operation, SoCs may group or segregate logic circuitry into power domains that can be independently powered OFF when not in use. By grouping the logic circuitry into power domains, the logic circuitry may be sequenced through multiple low power states. Generally, one or more Finite State Machines (FSMs) are utilized for sequencing logic circuitry through various low power states. A finite state machine is a sequential logic circuit that moves from one state to a next state responsive to one or more input signals. At each state, the finite state machine may assert one or more output signals to be applied to other circuitry.

Typically, an on-chip Power Management Controller (PMC) implements the power sequencing Finite State Machines. In the lowest power state, the PMC is typically connected to always on (AO) power rails associated with an AO power domain. It will be appreciated that in the lowest power states, all power rails of SoCs are turned OFF except the AO power rails. The circuitry that resides on the AO power rail is referred to as AO circuitry.

To prolong battery life further in the lowest power states where all rails barring the AO rail are shut off, the AO circuitry is subjected to rounds and rounds of optimization. This optimization is done by eliminating unnecessary AO circuitry to reduce area so that it consumes minimal active and leakage power.

Generally, with multiple power domains, the sequencing of low power states becomes increasingly difficult, which requires complex power sequencing FSMs implemented in the AO domain. These complex FSMs are prone to errors/bugs in their design. And hence it is desirable to implement debug logic circuitry for debug and optimization of these FSMs. Since the logic circuitry that needs to be debugged is implemented in AO rails, the debug logic circuitry also must be implemented on the same power rail as the power sequencing FSM.

However, adding debug logic circuitry on AO rails increases area which increases leakage power and is hence undesirable. Even if some minor/simple logic is added to AO rails, it fails to provide sufficient visibility for complex debugs of the power sequencing FSMs.

SUMMARY

Various disclosed embodiments are directed to methods and systems for debugging finite state machines (FSMs) that sequence the System-On-Chips (SOCs) through the lowest power state. The method includes implementing a debug logic circuit and connecting the debug logic circuit to a SOC voltage source. SOC voltage sources are turned off in lowest power states. The FSMs move from one low power state to next low power state and generate respective output signals. The method includes masking the output signals to generate respective masked output signals, and applying the masked output signals to the debug logic circuit to prevent it from entering into low power or reset states. The FSMs continue to move from one state to next state as they actually would in the lowest power scenario. The method allows debug logic circuitry to remain powered up to debug the FSMs and hence allows for debug of the lowest power of the SOC.

BRIEF DESCRIPTION

Reference is now made to the following descriptions taken in conjunction with the accompanying drawings, in which.

DETAILED DESCRIPTION

It is realized herein that a need exists for methods and apparatus for debugging finite state machines (FSMs) that sequence the System-On-Chips (SOCs) through the lowest power states where only the AO power rail is turned ON while other rails are turned off.

FIGS. 1-4, discussed below, and the various embodiments used to describe the principles of the present disclosure are by way of illustration only and should not be construed in any way to limit the scope of the disclosure. Those skilled in the art will recognize that the principles of the disclosure may be implemented in any suitably arranged device or a system. The numerous innovative teachings of the present disclosure will be described with reference to exemplary non-limiting embodiments.

Various disclosed embodiments are directed to apparatus and method for debugging FSMs that sequence the SOC through a plurality of low power states. According to certain disclosed embodiments, a finite state machine in AO power rail is operated to sequentially move from one low power state to a next low power state and generate respective output signals corresponding to the low power states. A debug logic circuit, which is coupled to the finite state machine, is configured to debug the finite state machine. The debug logic circuit is powered by a DC voltage source such as, for example, a system on chip (SoC) power rail.

According to certain disclosed embodiments, the methods and apparatus allow debugging FSMs with significantly reduced power penalty.

According to certain disclosed embodiments, as the finite state machine moves from a low power state to a next low power state and generates respective output signals, the output signals are masked (i.e. overridden) by software configurable masking circuits. If the output signals are not masked, the output signals would cause various changes in the system to prepare for entering/exiting into/from the low power states. These changes include, but not limited to, enabling clamps from circuitry on SOC rails to circuitry on AO rail, indicating to external Power Management Integrated Circuit to turn off the SOC Rail. The masked signals, however, prevent the SOC rail from turning off and disable clamp assertion. Thus, the finite state machine is operated normally to transition from one low power state to the next while the debug logic circuit is maintained in an ON state, thus allowing the debug logic circuit to debug the finite state machine while the finite state machine remains in one of the low or even the lowest power states. Essentially, to the finite state machine it appears that a real lowest power cycle is being executed. However, the debug circuitry and other related circuitry required for debug are kept alive to be able to debug the finite state machine 104 during fail scenarios.

Figure 1:
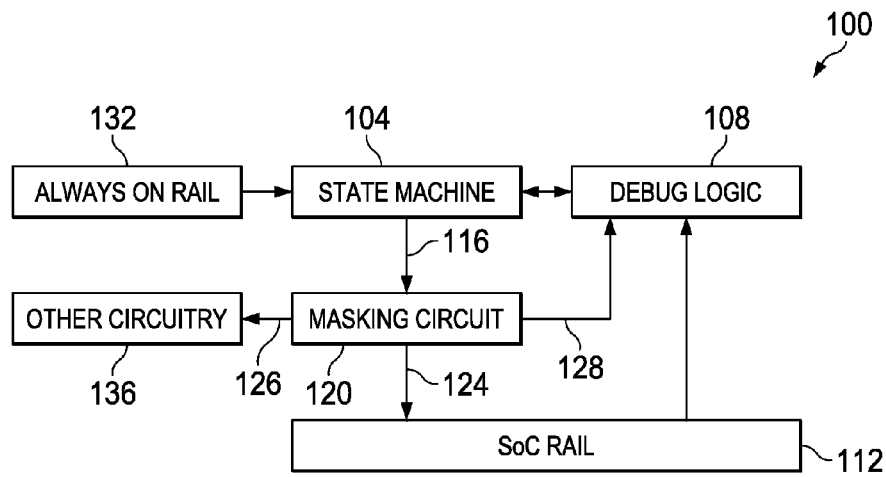
FIG. 1 is a block diagram of an apparatus for debugging a finite state machine.

FIG. 1 is a block diagram of apparatus 100 for debugging the finite state machine that sequences the SoC through the lowest power state. Apparatus 100 includes finite state machine 104 which during operation cycles from one low power state to next low power state. Apparatus 100 includes Always On Voltage Source 132 which powers the Finite State Machine 104. Apparatus 100 includes debug logic circuit 108 connected to finite state machine 104. Debug logic circuit 108 is configured to debug finite state machine 104. Apparatus 100 includes SoC voltage source 112 which applies a DC voltage to debug logic circuit 108. According to certain disclosed embodiments, SoC voltage source 112 may be implemented as a system on chip (SoC) power rail configured to provide DC voltage to debug logic circuit 108.

In operation, finite state machine 104 transitions the SoC through the lowest power state. It moves from one low power state to a next low power state and generates respective output signals 116. Output signals 116 are masked (i.e. overridden) by masking circuit 120 which generates masked output signals 124, 126 and 128. According to certain disclosed embodiments, masking circuit 120 may be implemented by one or more sequential logic circuits such as flip-flops and combinational logic circuits such as 2×1 muxes. Masked output signal 124 is applied to SoC power rail 112, preventing SoC power railing from turning OFF. Masked output signals 126 are also applied to other circuitry 136 to prevent assertion of clamps and powering down of chip IOs. Masked output signal 128 is applied to debug logic circuitry 108 to prevent assertion of debug reset. Thus, finite state machine 104 is operated normally to transition from one low power state to the next while debug logic circuit 108 is maintained in an ON state, which allows debug logic circuit 108 to debug the finite state machine 104 as the finite state machine sequences the SOC through the lowest power state.

Figure 2:
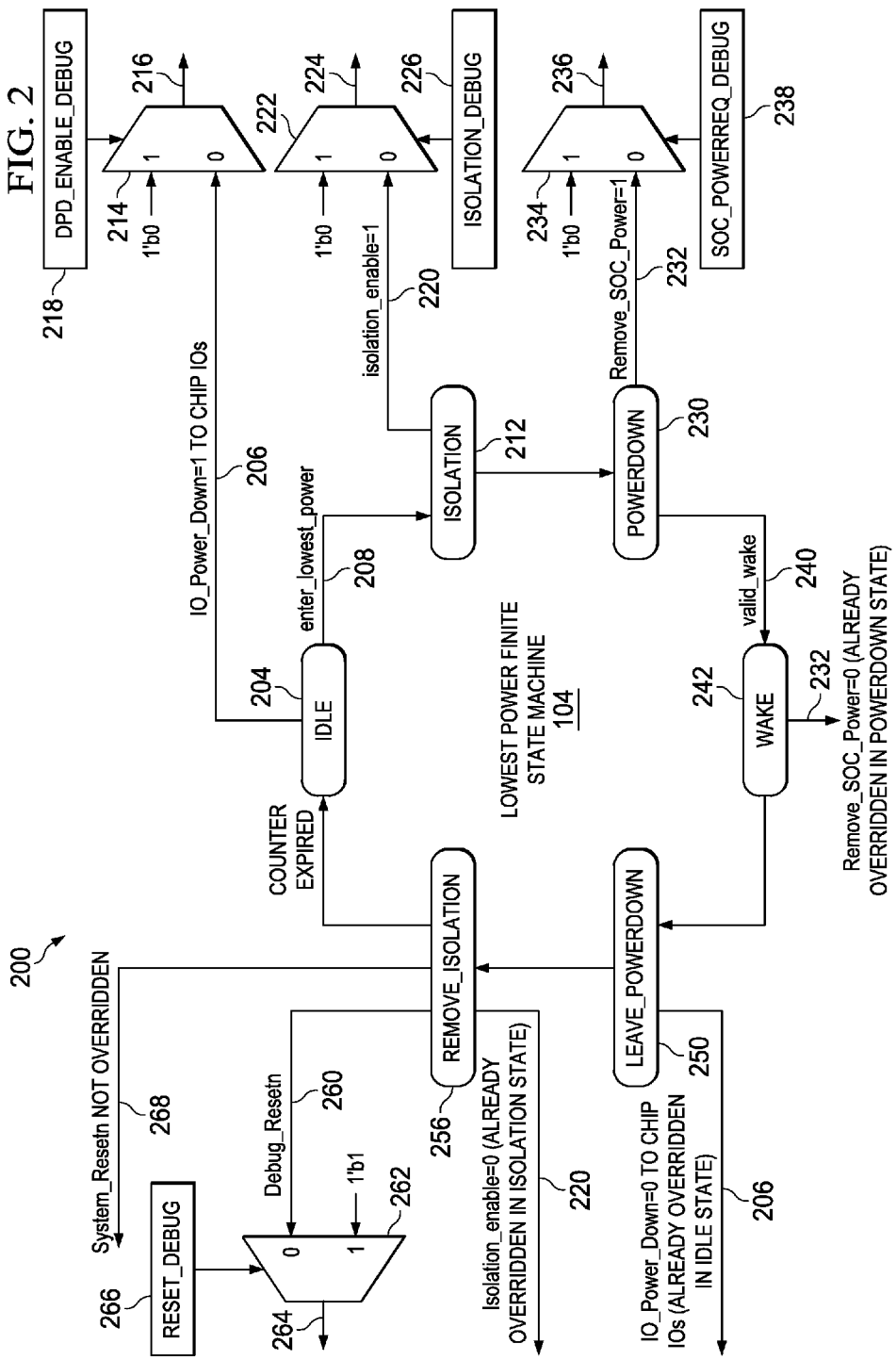
FIG. 2 illustrates a cycle of the finite state machine that sequences the SOC through the lowest power state.

FIG. 2 illustrates a simplified cycle 200 of finite state machine 104 wherein it moves from a low power state to a next low power state. Cycle 200 may be executed in an SOC as it detects periods of inactivity in the circuits. During these periods, it is desirable to switch off all the circuitry in the SOC barring the circuitry which would later help exit from the low power state. As discussed before, while finite state machine 104 moves from one low power state to the next, output signals asserted by finite state machine 104 are masked to generate masked output signals. The masked output signals are applied to one or more functional circuitry including SoC power rails, thereby preventing the SoC power rails from turning off. According to certain disclosed embodiments, the masking circuit may provide software programmable overrides to mask the output signals asserted by the finite state machine. The software overrides may be programmed in finite state machine 104 or may be programmed in an external debug logic circuit.

Referring again to FIG. 2, finite state machine 104 initially remains in low power IDLE state 204 and waits for a signal enter_lowest_power 208 to move to ISOLATION state 212 and generates output signal IO_POWER_DOWN 206.

It will be appreciated by those skilled in the art that in existing finite state machines, IO_Power_Down signal would have moved the chip I/Os into a deep power down state, which is generally the lowest power state for chip I/Os. In the deep power down state, a few I/Os maintain their receiver logic circuitry in an ON state to enable the I/Os to exit from the deep power down state while the remaining I/Os turn completely off. According to certain disclosed embodiments, IO_Power_Down signal 206 is masked or overridden by 2×1 mux 214 which generates masked output signal 216. Masked output signal 216 is applied to chip I/Os, thereby preventing the chip I/Os from entering into Deep Power Down, which allows the chip I/Os to remain powered up for use by the debug logic circuitry.

By way of example, 1 software configurable override bit implemented as a flip flop indicated as DPD_Enable_Debug 218, is applied to mux 214. When DPD_Enable_Debug 218 is set, IO_Power_Down signal to chip I/Os is disabled by masking operation, thus preventing chip I/Os from transitioning to their respective low power states.

Referring to FIG. 2, finite state machine 104 asserts Isolation_enable signal 220 in ISOLATION state 212. It will be appreciated by those skilled in the art that in existing finite state machines, the Isolation_enable signal enables isolation cells from SoC power domains to AO power domains. In SoC power domains, logic circuits may be independently powered OFF. For example, video circuit may be powered OFF when listening to audio alone. Isolation cells help in driving known values from powered down circuits to non-powered down circuits so that the circuits which are powered ON are not corrupted by the circuits that are powered-off.

According to certain disclosed embodiments, Isolation_enable signal 220 is masked by 2×1 mux 222 which generates masked output signal 224. By way of example, 1 software configurable override bit, implemented as a flip flop, indicated as Isolation_Debug 226, is applied to mux 222. When Isolation_Debug 226 is set, isolation cells from SoC power domains to AO power domains are disabled.

According to certain disclosed embodiments, finite state machine 104 moves from ISOLATION state 212 to POWER-DOWN state 230. It will be appreciated that in existing finite state machines, an on-chip power management controller (PMC) generally requests an external Power Management Integrated Circuit (PMIC) to remove SoC power by asserting Remove_SOC_Power 232 or equivalent signal in lowest power down state. PMIC turns off SoC rail when it detects Remove_SOC_Power 232 signal as high. Finite state Machine 104 remains in this state until a valid wake signal from an I/O is received. For example, a valid wake signal from an I/O may be a signal responsive to a touch or keyboard activity which initiates an exit from the power down state. According to certain disclosed embodiments, Remove_SOC_Power signal 232 is masked by 2×1 mux 234 which generates masked output signal 236. By way of example, 1 software configurable override bit SOC_POWERREQ_DEBUG, implemented as a flip-flop is applied to mux 234. The SOC_POWERREQ_DEBUG signal 238 masks the Remove_SOC_Power 232 to be propagated to the PMIC. Since PMIC does not see the Remove_SOC_Power signal, it does not turn off the SOC Power rail.

Upon receiving valid_wake signal 240, finite state machine 104 moves to low power WAKE state 242. WAKE state is the first state for exit from lowest power. In this state, state machine 104 deasserts the Remove_SOC_Power signal to indicate to the external PMIC to restore SOC Power. The external PMIC would turn on SOC rail in normal circumstances. However, given that the SOC_POWERREQ_DE- BUG bit was set to 1 the Remove_SOC_Power signal is already overridden to value 0 in signal 236 using override bit SOC_POWERREQ_DEBUG 238. Therefore, PMIC does not need to turn on the SOC rail simply because the override bit did not allow PMIC to turn off the SOC Rail in the POWERDOWN state 230.

From WAKE state 242, finite state machine 104 moves unconditionally into the LEAVE_POWERDOWN state 250. In this state finite state machine de-asserts IO_Power_Down signal 206. Under normal circumstances this would have activated chip I/Os' transmit and receive circuitry. However, given that the DPD_ENABLE_DEBUG bit 218 was set to 1 the IO_Power_Down 206 is already overridden to value 0 in signal 216. Therefore, the chip I/Os do not need to turn ON because they never turned OFF due to the DPD_ENABLE_DEBUG override bit 218 being set.

From LEAVE_POWERDOWN state 250, finite state machine 104 transitions unconditionally to REMOVE_ISOLATION state 256. In REMOVE_ISOLATION state, finite state machine de-asserts Isolation_enable signal 220 which under normal circumstances would have disabled the isolation cells between circuitry in SOC rail and circuitry in AO rail. However, given that the ISOLATION_DEBUG bit 226 was set to 1, the Isolation_enable signal is already overridden to value 0 in signal 224. Therefore, the isolation cells need not be disabled simply because they were never enabled due to the ISOLATION_DEBUG bit 226 being set.

In REMOVE_ISOLATION state, Finite state machine 104 also asserts 2 reset signals: Debug_Resetn 260 and System_Resetn 268. As part of removing Powergating or powering up, circuits require resets to be asserted so they may come up in known states. The Debug Circuitry is not reset since it is being used to debug the Finite State Machine 104. Hence only the Debug Circuitry reset needs to be overridden. According to certain disclosed embodiments, Debug_Resetn signal 260 is masked by 2×1 mux 262 which generates masked output signal 264. By way of example, RESET_DEBUG 266 implemented as a software configurable flip-flop is applied to mux 262 to mask Debug_Resetn signal 260. The RESET_DEBUG bit masks the Debug_Resetn going to the Debug circuitry. Hence, the Debug circuitry debugging the Finite State Machine 104 is not reset.

In REMOVE_ISOLATION, the System_Resetn output 268 which is used to reset the rest or part of the system is not overridden. As described before, the System_Resetn is required so that the circuits that were powered off wake up in known good values after powergating.

After a predetermined time period expires, the Finite State machine 104 moves to IDLE State 204 from the REMOVE_ISOLATION state 256, which completes one cycle of the lowest power entry and exit. The next cycle occurs when the next period of inactivity occurs and the signal enter_lowest_power 208 is re-asserted.

According to certain disclosed embodiments, the overrides are set by Software when finite state machine 104 moves through cycles of testing and debug. Once the debug process is complete, the override bits are restored to not assert.

According to certain disclosed embodiments, the invention may be used for profiling finite state machine 104. For example, the disclosed embodiments may be utilized to ascertain how long the finite state machine remained in each of the low power state.

Figure 3:
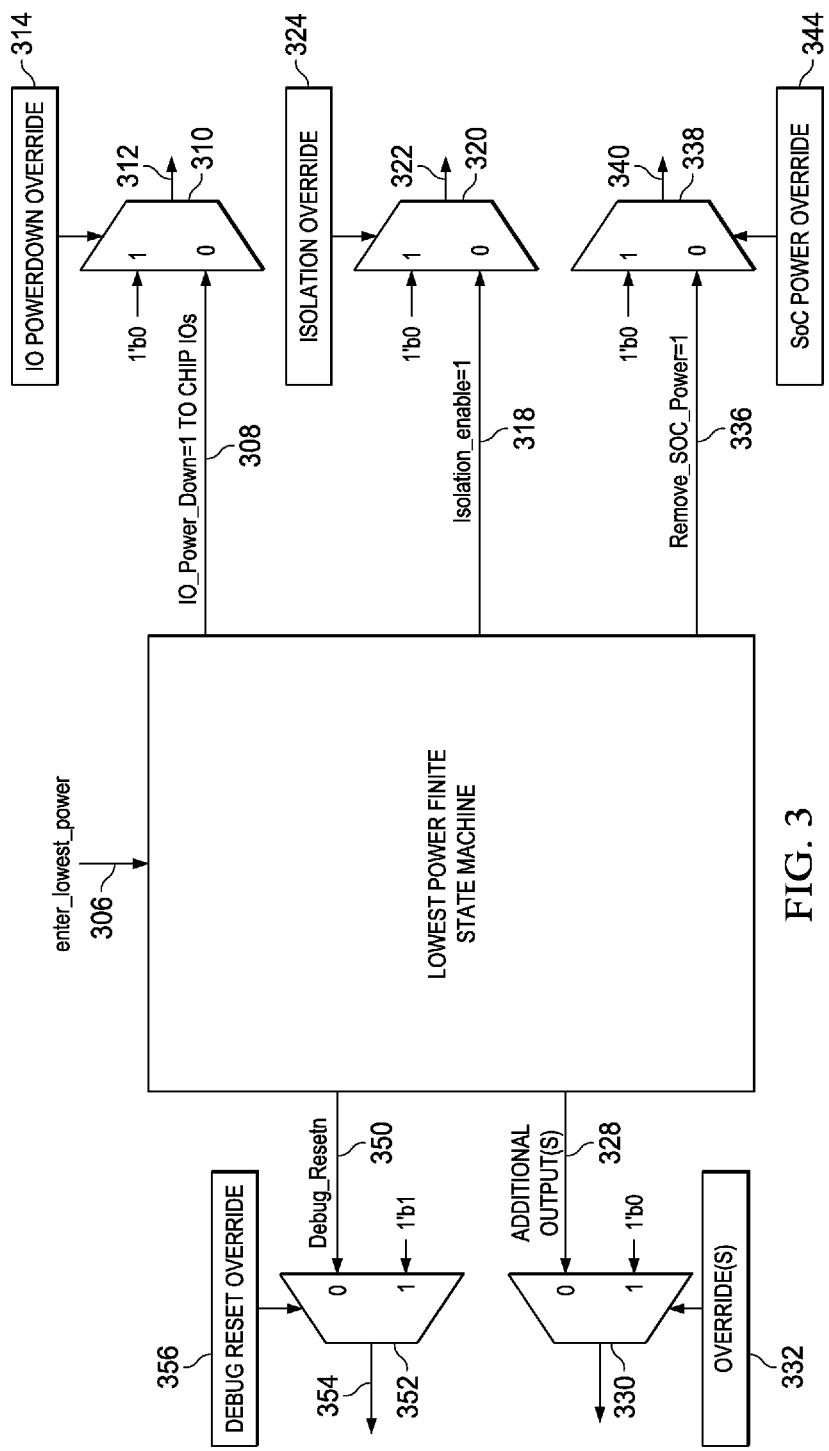
FIG. 3 illustrates a block diagram according to general principles of certain disclosed embodiments.

FIG. 3 is a block diagram illustrating general principles of the disclosed embodiments. The disclosed embodiments may be used in any Finite State Machine which needs to be debugged as the SOC sequences to the lowest power where only the AO rail is turned on while the SOC rail(s) are turned off. As discussed before, finite state machine 104 moves from one low power state to the next and asserts respective output signals in the low power states. The output signals are masked by, for example, software configurable flip-flops and 2×1 muxes which generate masked output signals.

Thus, by way of example, in response to signal enter_lowest_power 306 finite state machine 104 asserts IO_Power_Down signal 308 which is masked by 2×1 mux 310 to generate masked output signal 312. According to certain disclosed embodiments, IO Powerdown Override flip flop 314 is applied to 2×1 mux 310 to mask IO_Power_Down signal 308. Thereafter, finite state machine 104 moves to a low power ISOLATION state wherein it asserts Isolation_enable signal 318. 2×1 Mux 320 masks Isolation_enable signal 318 and generates masked output signal 322. According to certain disclosed embodiments, Isolation Override flip flop 324 is applied to flip-flop 320 to mask isolation enable signal 318.

According to certain disclosed embodiments, finite state machine 104 asserts Remove_SOC_Power signal 336 in a low power wake state. 2×1 mux 338 masks Remove_SOC_Power required signal 336 and generates masked output signal 340. According to certain disclosed embodiments, Soc Power Override flip flop 344 is applied to 2×1 mux 338 to mask power required signal 336.

According to certain disclosed embodiments, finite state machine 104 asserts Debug_Resetn signal 350 in REMOVE_CLAMP state. Debug_Reset override signal 356 is applied to 2×1 mux 354 which masks Debug_Resetn signal 350 and generates masked output signal 354. According to certain disclosed embodiments, Debug Reset override flip flop 356 is applied to 2×1 mux 352 to mask Debg_Resetn signal 350 to generate overridden signal 354. Finite state machine 104 may assert additional output signals 328 in other low power states. These additional output signals 328 may be overridden by 2×1 mux 330 by applying override signal 332 to mux 330.

Figure 4:
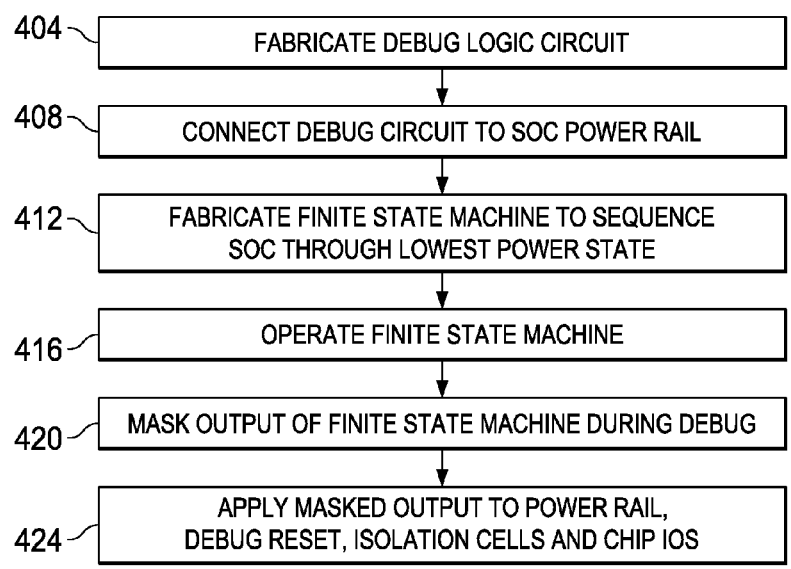
FIG. 4 is a flowchart of a process according to certain disclosed embodiments.

FIG. 4 is a flowchart of a process according to certain disclosed embodiments. Such a process can be performed by any apparatus configured to perform a process as described.

In block 404, a debug logic circuit is implemented on the SoC.

In block 408, the debug logic circuit is connected to a DC voltage source which may, for example, be a Power Gate-able SoC power rail.

In block 412, a finite state machine is implemented to sequence the SoC through the lowest power state.

In block 416, the finite state machine on Always On Rail is operated to sequentially move from one low power state to a next low power state. The finite state machine generates respective output signals corresponding to the low power states.

In block 420, the output signals of the finite state machine are masked to generate masked output signals. According to certain disclosed embodiments, the finite state machine outputs are masked as they are generated when the finite state machine is debugged.

In block 424, the masked output signals are applied sequentially to the SoC power rails, thus preventing the SoC power rails from transitioning to the low power states. Consequently, the SoC power are maintained in an ON state while the finite state machine moves from a low power state to the next low power state. The finite state machine is debugged by the debug logic circuit while the finite state machine transitions the rest of the system into the low power state.

Those skilled in the art will recognize that, for simplicity and clarity, the full structure and operation of all systems suitable for use with the present disclosure is not being depicted or described herein. Instead, only so much of a system as is unique to the present disclosure or necessary for an understanding of the present disclosure is depicted and described. The remainder of the construction and operation of the disclosed systems may conform to any of the various current implementations and practices known in the art.

Of course, those of skill in the art will recognize that, unless specifically indicated or required by the sequence of operations, certain steps in the processes described above may be omitted, performed concurrently or sequentially, or performed in a different order. Further, no component, element, or process should be considered essential to any specific claimed embodiment, and each of the components, elements, or processes can be combined in still other embodiments.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium used to carry out the distribution. Examples of machine usable/readable or computer usable/readable mediums include: non-volatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Those skilled in the art to which this application relates will appreciate that other and further additions, deletions, substitutions and modifications may be made to the described embodiments.

What is claimed is:

1. A method for debugging a finite state machine (FSM) that sequences System-On-Chips (SOCs) through low power states including a lowest power state, comprising:
   implementing an on-chip debug logic circuit;
   connecting the debug logic circuit to a power gate-able voltage source of a system on chip (SoC);
   operating the finite state machine connected to an Always On voltage source to sequence the SoC through the low power states by moving from a low power state to a next low power state and generating respective output signals corresponding to the low power states;
   masking the respective output signals to generate respective masked output signals;
   applying the respective masked output signals to circuit elements of the SoC to prevent the debug logic circuit from transitioning into the low power states;
   applying the respective masked output signals to circuit elements of the debug logic circuit to prevent the debug logic circuit from entering into a reset state; and
   debugging the finite state machine in the lowest power state by the debug logic circuit.

2. The method of claim 1, wherein the respective masked output signals prevent IOs of the SoC from transitioning to the low power states.

3. The method of claim 1, wherein the respective masked output signals override isolation cells.

4. The method of claim 1, wherein the respective masked output signals prevent a voltage rail of the SoC from turning off.

5. The method of claim 1, wherein the respective masked output signals override debug reset signals.

6. The method of claim 1, further comprising:
   applying a first input signal to the finite state machine;
   transitioning the finite state machine from an idle state to an isolation state in response to the first input signal;
   generating and asserting by the finite state machine a first output signal during the transitioning into the isolation state;
   masking the first output signal to generate a first masked output signal; and
   applying the first masked output signal to IOs of the SoC.

7. The method of claim 6, further comprising:
   transitioning the finite state machine from the isolation state to a power down state;
   generating and asserting by the finite state machine a second output signal during the transitioning to the power down state;
   masking the second output signal to generate a second masked output signal; and
   applying the second masked output signal to isolation cells.

8. The method of claim 7, further comprising:
   transitioning by the finite state machine from the power down state to a wake state; and
   generating and asserting a third output signal during the transitioning into the wake state, wherein the third output signal prevents a power rail of the SoC from turning off.

9. The method of claim 8, further comprising:
   transitioning by the finite state machine from the wake state to a leave power down state; and
   de-asserting the third output signal during the transitioning into the leave power down state.

10. The method of claim 9, further comprising:
    transitioning by the finite state machine from the leave power down state to a remove isolation state; and
    de-asserting the first output signal during the transitioning to the remove isolation state.

11. The method of claim 10, further comprising:
    transitioning by the finite state machine from the remove isolation state to the idle state;
    de-asserting the second output signal during the transitioning to the idle state; and
    generating and asserting by the finite state machine a fourth output signal during the transitioning to the idle state;
    masking the fourth output signal to generate a fourth masked output signal;
    applying the fourth masked output signal to the debug logic circuit preventing it from entering into reset;
    generating and asserting by the finite state machine a fifth output signal during the transitioning to the idle state;
    applying the fifth output signal directly without masking to the SoC circuit elements to enter into reset.

12. An integrated circuit, comprising:
    a finite state machine configured to sequence a system on chip (SoC) through low power states including a lowest power state and generating respective output signals corresponding to the low power states;
    a debug logic circuit connected to the finite state machine and configured to debug the finite state machine;
    a system on chip (SoC) voltage source connected to the debug logic circuit;
    a masking circuit configured to mask the output signals and to generate masked output signals,
    wherein the masked output signals are applied to circuit elements of the SoC to prevent the SoC circuit elements from transitioning into the low power states and to prevent the debug logic circuit from entering into reset, and wherein the debug logic circuit debugs the finite state machine as the finite state machine sequences the SoC through the lowest power state.

13. The integrated circuit of claim 12, wherein the masked output signals prevent IOs of the SoC from transitioning to the low power states.

14. The integrated circuit of claim 12, wherein the masked output signals override IOs of the SoC from powering down.

15. The integrated circuit of claim 12, wherein the masked output signals override isolation cells.

16. The integrated circuit of claim 12, wherein the masked output signals allow IOs of the SoC to remain powered-up for use by the debug logic circuitry.

17. The integrated circuit of claim 12, wherein the masked output signals prevent a voltage rail of the SoC from turning off.

18. The integrated circuit of claim 12, wherein the masked output signals override a debug reset signal.

19. The integrated circuit of claim 12, further comprising:
a flip-flop circuit and a 2×1 mux configured to receive a first output signal from the finite state machine when the finite state machine transitions from an idle state to an isolation state in response to a first input signal, the masking circuit configured to generate a first masked output signal, wherein the first masked output signal is applied to IOs of the SoC.

20. The integrated circuit of claim 19, wherein the flip-flop circuit and a second 2×1 mux are configured to receive a second output signal from the finite state machine when the finite state machine transitions from the isolation state to a power down state, wherein the masking circuit is configured to generate a second masked output signal, and wherein the second masked output signal is applied to isolation cells.

21. The integrated circuit of claim 20, wherein the flip-flop circuit and a third 2×1 mux are configured to receive a third output signal from the finite state machine when the finite state machine transitions from the power down state to a wake state, wherein the masking circuit is configured to generate a third masked output signal, and wherein the third masked output signal prevents a power rail of the SoC from turning off.

22. The integrated circuit of claim 21, wherein the finite state machine is configured to transition from the wake state to a leave power down state, and wherein the finite state machine de-asserts the third output signal in the leave power down state.

23. The integrated circuit of claim 22, wherein the finite state machine is configured to transition from the leave power down state to a remove isolation state and is configured to de-assert the first output signal.

24. The integrated circuit of claim 23, wherein the flip-flop circuit and a fourth 2×1 mux are configured to receive a fourth output signal from the finite state machine when the finite state machine transitions from the remove isolation state to the idle state, wherein the masking circuit is configured to generate the fourth masked output signal, and wherein the fourth masked output signal prevents the debug logic circuit from entering into reset.

\* \* \* \* \*